(12) United States Patent
Then et al.

(10) Patent No.: US 10,804,214 B2
(45) Date of Patent: Oct. 13, 2020

(54) GROUP III-N MATERIAL CONDUCTIVE SHIELD FOR HIGH FREQUENCY METAL INTERCONNECTS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/302,420

(22) PCT Filed: Jun. 27, 2016

(86) PCT No.: PCT/US2016/039522
§ 371 (c)(1),
(2) Date: Nov. 16, 2018

(87) PCT Pub. No.: WO2018/004510
PCT Pub. Date: Jan. 4, 2018

(65) Prior Publication Data
US 2019/0181099 A1    Jun. 13, 2019

(51) Int. Cl.
*H01L 29/66*    (2006.01)
*H01L 23/552*    (2006.01)
(Continued)

(52) U.S. Cl.
CPC ........ *H01L 23/552* (2013.01); *H01L 21/8252* (2013.01); *H01L 23/5225* (2013.01);
(Continued)

(58) Field of Classification Search
CPC ... H01L 23/552; H01L 23/5225; H01L 23/66; H01L 29/15; H01L 29/155; H01L 29/872;
(Continued)

(56) References Cited

U.S. PATENT DOCUMENTS 9,660,067 B2 * 5/2017 Then .................. H01L 29/4236
2003/0020069 A1   1/2003 Holmes et al.
(Continued)

FOREIGN PATENT DOCUMENTS

WO    2018004510 A1    1/2018

OTHER PUBLICATIONS

International Search Report and Written Opinion recieved for PCT Application No. PCT/US2016/039522. dated Mar. 27, 2017. 13 pages.
(Continued)

*Primary Examiner* — Chuong A Luu
(74) *Attorney, Agent, or Firm* — Finch & Maloney PLLC

(57) ABSTRACT

Integrated circuit structures configured with low loss transmission lines are disclosed. The structures are implemented with group III-nitride (III-N) semiconductor materials, and are well-suited for use in radio frequency (RF) applications where high frequency signal loss is a concern. The III-N materials are effectively used as a conductive ground shield between a transmission line and the underlying substrate, so as to significantly suppress electromagnetic field penetration at the substrate. In an embodiment, a group III-N polarization layer is provided over a gallium nitride layer, and an n-type doped layer of indium gallium nitride ($In_zGa_{1-z}N$) is provided over or adjacent to the polarization layer, wherein z is in the range of 0.0 to 1.0. In addition to providing transmission line ground shielding in some locations, the III-N materials can also be used to form one or more active
(Continued)

and/or passive components (e.g., power amplifier, RF switch, RF filter, RF diode, etc).

20 Claims, 11 Drawing Sheets

(51) Int. Cl.

| | | |
|---|---|---|
| *H01L 23/66* | (2006.01) | |
| *H01P 3/00* | (2006.01) | |
| *H01L 23/522* | (2006.01) | |
| *H01L 21/8252* | (2006.01) | |
| *H01L 27/06* | (2006.01) | |
| *H01L 49/02* | (2006.01) | |
| *H01L 29/20* | (2006.01) | |
| *H01L 29/205* | (2006.01) | |
| *H01L 29/778* | (2006.01) | |
| *H01P 11/00* | (2006.01) | |

(52) U.S. Cl.
CPC .......... *H01L 23/66* (2013.01); *H01L 27/0605* (2013.01); *H01L 28/10* (2013.01); *H01L 28/20* (2013.01); *H01L 28/40* (2013.01); *H01L 29/2003* (2013.01); *H01L 29/205* (2013.01); *H01L 29/66462* (2013.01); *H01L 29/7787* (2013.01); *H01P 3/003* (2013.01); *H01P 11/003* (2013.01); *H01L 2223/6627* (2013.01)

(58) Field of Classification Search
CPC ... H01L 29/2003; H01L 29/205; H01L 29/66; H01L 29/66462; H01L 29/7787; H01L 29/778; H01L 29/7786; H01L 29/045; H01L 29/423; H01L 29/0847; H01L 29/08; H01L 29/20; H01L 29/4236; H01L 29/66431; H01L 29/45; H01L 29/66446; H01L 29/7783; H01L 29/7784; H01L 2223/6627
USPC .......................................................... 257/76
See application file for complete search history.

(56) References Cited

U.S. PATENT DOCUMENTS

| | | | |
|---|---|---|---|
| 2003/0022395 A1* | 1/2003 | Olds | ........................ C30B 25/02 438/3 |
| 2003/0136986 A1 | 7/2003 | ElMasry et al. | |
| 2013/0112986 A1 | 5/2013 | Hsiung et al. | |
| 2013/0271208 A1 | 10/2013 | Then et al. | |
| 2015/0236101 A1 | 8/2015 | Chiang et al. | |

OTHER PUBLICATIONS

International Preliminary Report on Patentability recieved for PCT Application No. PCT/US2016/039522. dated Jan. 10, 2019. 10 pages.

* cited by examiner

GROUP III-N MATERIAL CONDUCTIVE SHIELD FOR HIGH FREQUENCY METAL INTERCONNECTS

BACKGROUND

Transmission lines are sometimes used in high frequency integrated circuit designs. However, there are a number of non-trivial problems associated with typical transmission line configurations, particularly with respect to preventing electromagnetic field penetration at the substrate, as will be discussed in turn.

DETAILED DESCRIPTION

Integrated circuit structures configured with relatively low loss transmission lines are disclosed. The structures are generally implemented with group III-nitride (III-N) semiconductor materials, and are particularly well-suited for use in radio frequency (RF) applications where high frequency signal loss is a concern. For instance, the structures are particularly helpful in applications employing silicon substrates, which are lossy in RF applications and therefore typically excluded from use in such applications. The III-N materials are effectively used as a conductive ground shield between a transmission line and the underlying substrate, so as to significantly suppress electromagnetic field penetration at the substrate. In an embodiment, a group III-N polarization layer is provided over a gallium nitride layer, and an n-type doped layer of indium gallium nitride ($In_zGa_{1-z}N$) is provided over or adjacent to the polarization layer, wherein z is in the range of 0.0 to 1.0. Selective deposition or forming techniques can be used to provide the III-N materials only in locations where shielding is needed. In some embodiments, in addition to providing transmission line ground shielding in some locations, the III-N materials can also conveniently be used to form active and/or passive components (e.g., power amplifier, RF switch, RF filter, RF diode, etc) in other locations.

General Overview

Figure 1A:
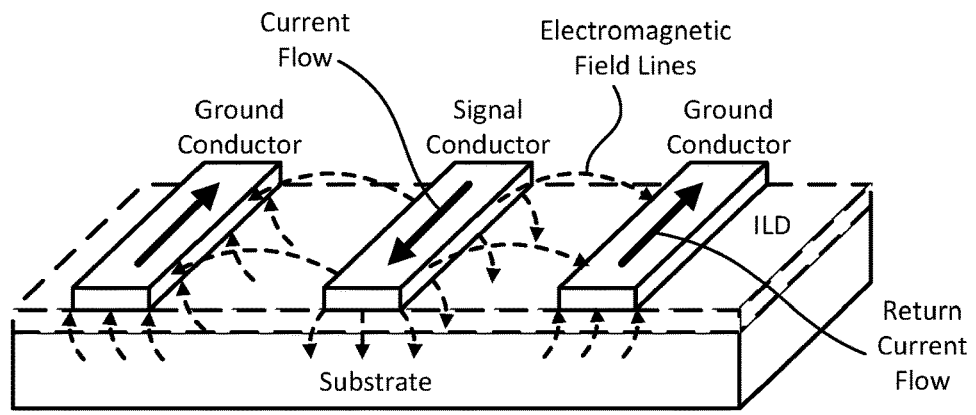
FIGS. 1a-1c illustrate example integrated circuit transmission line configurations.
Figure 1B:
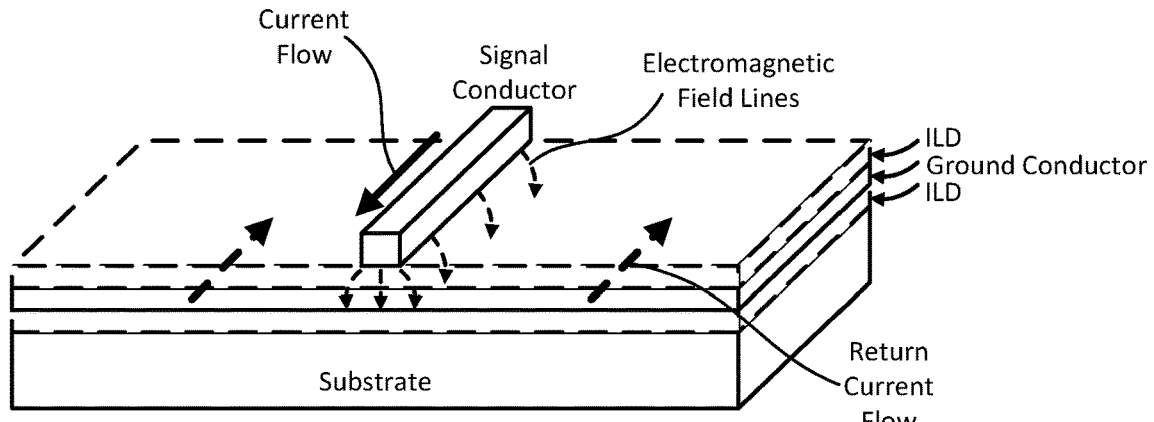
Figure 1C:
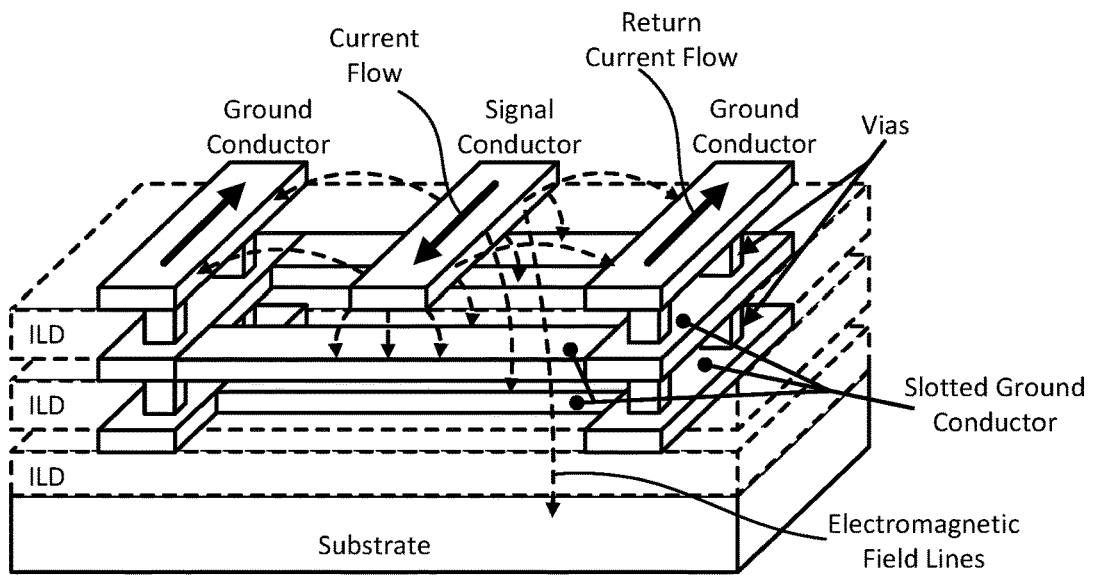

As previously noted, there are a number of non-trivial problems associated with typical transmission line configurations. A relatively simple design of a coplanar transmission line on an interlayer dielectric (ILD) on a substrate is shown in FIG. 1a. As can be seen, a signal conductor is provided between two ground conductors. Current flows through the signal conductor, and return current flows through the ground conductors. Because all three conductors are on the same side of the ILD layer, the waveguide is said to be co-planar. The return conductors are separated from the signal conductor by a gap that runs the length of the signal conductor. The thickness of the ILD layer can be set such that electromagnetic fields dissipate before they reach or otherwise escape to the underlying substrate. For purposes of this example, assume that the substrate is a bulk silicon substrate, the ILD is a layer of silicon dioxide ($SiO_2$) or silicon nitride (SiN), and the signal and ground conductors are tungsten or some other suitable conductor material (e.g., aluminum, gold, silver, nickel, titanium, alloys thereof, etc). As can be further seen, there is no shielding. Thus, if the ILD layer is not thick enough, electromagnetic field penetration (depicted as dashed arrows) at the substrate is not suppressed. As such, there may be significant signal power loss at high frequencies. Another example transmission line design is shown in FIG. 1b, which includes substrate shielding. As can be seen, the ground conductor in this configuration includes a layer sandwiched between ILDs, and acts as a shield between the signal conductor and the substrate thereby preventing electromagnetic field penetration at the substrate. The current and return current flows are shown. However, note that the signal conductor has to be very narrow or the height (distance) between the signal conductor and the ground conductor (shield) has to be large in order to achieve reasonable line impedance for RF circuit matching. At high frequencies, such narrow signal conductors typically result in high ohmic losses and signal degradation. Another example transmission line design is shown in FIG. 1c, which includes a shielded coplanar configuration. As can be seen, the signal conductor is provided between two ground conductors in a similar fashion as shown in FIG. 1a. In addition, a shield structure is implemented in multiple layers in the form of a slotted ground conductor. This structure is slotted to prevent return current from flowing in the ground plane and provide ground shielding, but also to allow for reasonable line characteristic impedances at the same time. However, because of the slotted nature, there inevitably will be stray electromagnetic field penetration to the substrate, as shown by dashed arrows extending from the signal conductor to the substrate.

Thus, and in accordance with an embodiment of the present disclosure, integrated circuit structures configured with relatively low loss transmission lines are disclosed. The structures are generally implemented with group III-nitride (III-N) semiconductor materials, and are particularly well-suited for use in radio frequency (RF) applications. The III-N materials are effectively used as a conductive ground shield between a given transmission line and the underlying substrate, so as to significantly reduce displacement and eddy currents in the substrate. In an embodiment, a III-N material stack includes a group III-N polarization layer over a gallium nitride layer, and an n-type doped layer of indium gallium nitride ($In_zGa_{1-z}N$) over the polarization layer, wherein z is in the range of 0.0 to 1.0. In some cases, the polarization layer is configured to induce formation of a two-dimensional electron gas (2DEG) in a channel region of the gallium nitride layer. However, note that a 2DEG is not required for all embodiments, such as those where the III-N stack doesn't include any active channel regions and is used only as a ground shield in some embodiments, or in still other embodiments as a ground shield in some locations and a passive component in other locations.

In some embodiments, the n-type doped $In_zGa_{1-z}N$ layer is deposited during source/drain regrowth for a transistor, such that the n-type doped $In_zGa_{1-z}N$ layer can be used for both transmission line ground shielding in some locations and source/drain regions in other locations. In such cases, note that the n-type doped $In_zGa_{1-z}N$ layer can be selectively deposited (e.g., using masking or other selective deposition techniques) to provide the n-type doped $In_zGa_{1-z}N$ layer in the various desired locations for source and drain regions and various desired other locations for shielding regions, to avoid subsequent etching of the n-type doped $In_zGa_{1-z}N$ layer.

In still other embodiments, transmission line ground shielding is provided by a patchwork of diverse neighboring material layers and structures that collectively form a continuous transmission line ground shield. For instance, the transmission line ground shield may be provided by a combination of a slotted ground plane in the interconnect layers, a III-N stack as described above in some locations, an n-type doped $In_zGa_{1-z}N$ layer in still other locations, a III-N polarization layer in still other locations; and an isolation oxide in still other locations. As will be appreciated, the disclosed techniques are particularly helpful in applications employing silicon substrates, which are excessively lossy in RF applications. To this end, the techniques provided herein allow for use of silicon substrates in RF transmission line applications. Numerous variations and embodiments will be apparent in light of this disclosure.

As used herein, group III-N semiconductor material (or III-N material or simply III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN), to name a few examples of III-N materials. Further note that all ranges provided herein are inclusive, unless otherwise specified to the contrary. Thus, for instance, an n-type doped layer of indium gallium nitride ($In_zGa_{1-z}N$) where z is in the range of 0.0 to 1.0 can be GaN (where z=0.0) or an InGaN compound (where 0.0<z<1.0) or InN (where z=1.0).

Use of the techniques and structures provided herein can be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can be used to show III-N material layers being used in one or more locations for transmission line shielding.

Structure and Methodology

Figure 2:
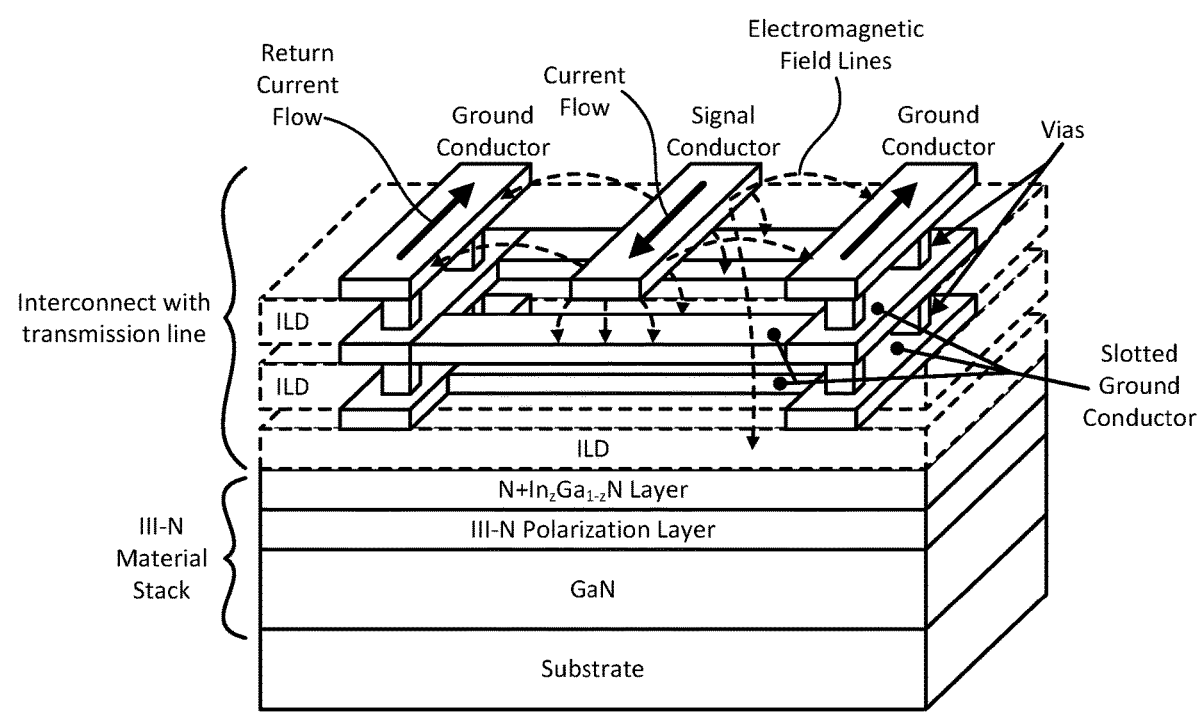
FIG. 2 illustrates an integrated circuit transmission line structure configured in accordance with an embodiment of the present disclosure.

FIG. 2 illustrates an integrated circuit transmission line structure configured in accordance with an embodiment of the present disclosure. As can be seen in this example case, the structure generally includes a group III-N semiconductor material stack formed on a substrate. A multilayer interconnect including a co-planar transmission line having a slotted ground conductor configuration is formed over the III-N stack. The current and return current flows are shown, as are the electromagnetic field lines. Note the electromagnetic field cannot penetrate the III-N stack. In some embodiments, one or more active and/or passive components may be formed in certain locations of the III-N stack, while other locations of the III-N material stack provide transmission line ground shielding. The components may include, for instance, RF amplifiers, RF filters (active and passive), RF switches, low noise amplifiers, to name a few examples. Alternatively, or in addition, active and/or passive components may be formed in the interconnect layer (such as a capacitor in the interconnect pathway, or a backend switching transistor or signal amplifier), in some embodiments. In any such cases, the signal conductor of the transmission line can be coupled to a given component or node to provide a high frequency signal path. As previously explained, many commonly used transmission line configurations are susceptible to electromagnetic field penetration at the substrate, despite shielding afforded by the slotted ground conductor.

As noted, the transmission line of this example case is a co-planar configuration having a signal conductor between two ground conductors, and a multi-layer slotted ground conductor to provide shielding, as previously described with reference to FIG. 1c. Other embodiments may include other transmission line configurations susceptible to electromagnetic field penetration at the substrate, and the present disclosure is not intended to be limited to any particular such configurations. A typical transmission line generally includes at least one signal conductor and at least one ground conductor. They may or may not be arranged in a co-planar fashion. In a more general sense, the techniques provided herein can be used to provide shielding between any given signal conductor and a given substrate, as will be appreciated.

The group III-N semiconductor material stack of this example embodiment includes a gallium nitride (GaN) layer over a substrate, such as a bulk silicon substrate or silicon-on-insulator (SOI) substrate or other substrate configuration that tends to be lossy as RF frequencies in a transmission line application. A group III-N polarization layer is provided over the GaN layer. An n-type doped layer of indium gallium nitride ($N+In_zGa_{1-z}N$) is provided over and/or adjacent to the polarization layer, wherein z is in the range of 0.0 to 1.0. Thus, this doped layer may be n-doped indium nitride, n-doped indium gallium nitride, or n-doped gallium nitride, depending on the value of z. The transmission line structure is provided over the n-type doped layer of $In_zGa_{1-z}N$ in this example embodiment. In still other embodiments, note that the transmission line structure can be shielded by the n-type doped layer of In$_z$Ga$_{1-z}$N in some locations and the III-N polarization layer in still other locations. To this end, further note the n-type doped layer of In$_z$Ga$_{1-z}$N may be adjacent to the III-N polarization layer rather than stacked thereon, at least in some location of the overall integrated circuit structure.

As previously explained, the III-N material stack may include one or more components, whether they be active, passive so some combination thereof. In some embodiments, for example, the GaN layer includes a channel region of a III-N transistor, and the III-N polarization layer is configured to induce formation of 2DEG in the channel region. The III-N transistor can be, for example, configured as an RF amplifier or RF switch, such as those used in a front end of an RF communication chip or chip set (e.g., system-on-chip). Further note that the III-N transistor may be operatively coupled to the transmission line that is effectively shielded by the 2DEG (or at least an upper layer thereof) in at least some locations over the substrate. In still other embodiments, the transmission line may be coupled to any number of other active or passive components, such as resistors, inductors, capacitors, amplifier configurations, active filter configurations, passive filter configurations, switching configurations, etc).

The III-N polarization layer can also vary from embodiment to embodiment. In general, the thickness of the polarization layer depends on factors such as the concentration of aluminum therein (if any). For instance, a polarization layer that is lattice matched to the GaN layer can be as thick as desired, such as a polarization layer implemented with Al$_{0.83}$In$_{0.17}$N, which is perfectly lattice matched to GaN and thus causes no stress on the GaN layer. In such cases, the polarity layer thickness can be, for instance, in the range of 1 nm to 50 nm, or even higher. On the other hand, a III-N polarization layer having a relatively high aluminum content relative to the concentration of indium and/or gallium will tend to cause tensile stress on the polarization layer, and therefore the thickness of the polarization layer will be constrained to be relatively thinner.

For instance, in another embodiment, if the III-N polarization layer is Al$_x$In$_{1-x}$N, wherein x is in the range of greater than 0.83 up to and including 1.0, then the polarization layer thickness is in the range of about 1 nm to 5 nm (e.g., 3 nm). In another embodiment, if the polarization layer is Al$_x$Ga$_{1-x}$N, wherein x is in the range of say about 0.35 to 0.5, then the polarization layer thickness is in the range of about 1 nm to 10 nm. In still another example embodiment, if the polarization layer is Al$_x$In$_y$Ga$_{1-x-y}$N, wherein x is in the range of 0.9 to 1.0, and y is in the range of 0.05 to 0.1, then the polarization layer thickness can be in the range of about 1 nm to 30 nm. In this example case, note that the presence of both the indium and gallium tend to soften the tensile stress attributable to the aluminum. In still another embodiment, if the polarization layer is In$_x$Ga$_{1-x}$N, wherein x is in the range of 0.05 to 0.2 then the polarization layer thickness can be in the range of about 1 nm to 40 nm, or higher (no aluminum). Numerous other III-N polarization layer configurations implemented with III-N compositions and providing various degrees to tensile or compressive strain on the GaN layer will be apparent in light of this disclosure.

As previously explained, in some embodiments, the III-N polarization layer can serve the dual purpose of inducing a 2DEG in the GaN layer in some locations and for providing transmission line ground shielding in other locations. In some example cases, the n-type doped layer of In$_z$Ga$_{1-z}$N grown on top of an underlying 2DEG can be used to further improve the sheet conductivity and electrical contact between any metal interconnects and the underlying 2DEG induced by the III-N polarization layer and further improve shielding. The dopant concentration of the n-type doped layer of In$_z$Ga$_{1-z}$N can vary from one embodiment to the next, and in some cases is in the range of $1 \times 10^{18}$ to $1 \times 10^{21}$ atoms/cm$^3$, or in still other cases in the range of $5 \times 10^{19}$ to $3 \times 10^{20}$ atoms/cm$^3$. In a more general sense, the doping can be adjusted to increase sheet conductivity and electrical contact between metal interconnects and the 2DEG, so higher doping levels may be used as needed to achieve a targeted range of conductivity.

Further note that the doping concentration will depend to some extent on the value of z. For instance, if z is equal to 0.0, then the n-type doped layer of In$_z$Ga$_{1-z}$N will be implemented with GaN, which is currently difficult to dope above say about $5 \times 10^{19}$ atoms/cm$^3$. However, as will be further appreciated, as reactor tools improve over time with respect to process controls regarding factors such as temperature, pressure, and gas flow, the doping concentration may be readily increased or otherwise adapted to higher levels. To this end, the techniques provided herein can be effectively used with any number of doping concentrations, and the present disclosure is not intended to be limited to any particular dopant range.

The dopant of the n-type doped layer of In$_z$Ga$_{1-z}$N can vary as well. In some embodiments, the N-type doped layer of In$_z$Ga$_{1-z}$N is doped, for example, with silicon and/or germanium. Likewise, as previously noted, the value of z may vary from one embodiment to the next. In some embodiments, for example, z is in the range of 0.01 to 0.99, or 0.03 to 0.9, or 0.04 to 0.8, or 0.05 to 0.7, or 0.05 to 0.5, or 0.05 to 0.4, or 0.05 to 0.2 to name a few example ranges. In other embodiments, z is 0.0 such that the n-type doped layer of In$_z$Ga$_{1-z}$N is GaN. In still other embodiments, z is 1.0 such that the n-type doped layer of In$_z$Ga$_{1-z}$N is InN. The thickness of the n-type doped layer of In$_z$Ga$_{1-z}$N can vary as well, but in some embodiments is in the range of about 10 nm to about 2 microns, or 20 nm to 2 microns, or 20 nm to 1 microns, or 20 nm to 500 nm, or 20 nm to 200 nm, to name a few examples. Numerous other example variations and configurations will be apparent in light of this disclosure.

The interlayer dielectrics (ILDs) of the interconnect can be, for example, silicon dioxide or silicon nitride or other suitable dielectric material. In some cases, the ILDs are implemented with a low-k dielectric material having a dielectric constant that is less than that of silicon dioxide, such as porous silicon dioxide, carbon-doped silicon dioxide, porous carbon-doped silicon dioxide, spin-on organic or silicon-based polymeric dielectric, to name a few examples. The signal and ground conductors making up the transmission line can be implemented with, for example, tungsten, gold, aluminum, nickel, titanium, copper, or any other suitable conductor material, whether in elemental or compound form. As will be appreciated, the shape and layout of the signal and ground conductors can also be tailored to a given application, depending on factors such as the frequency range of operation and signal power. The vias are used to connect one sub-layer of the interconnect to another sub-layer of the interconnect. The vias may have any suitable structure, such as damascene and dual damascene structures, and can be implemented with conductive via materials, such as copper, tungsten, etc.

Thus, to summarize, a III-N polarization layer can be provided to induce the formation of 2DEG in a GaN channel. The 2DEG and/or an n-type doped layer of In$_z$Ga$_{1-z}$N over the 2DEG can be used as a conductive ground shield between a given transmission line and the underlying substrate, so as to significantly reduce displacement and eddy currents in the substrate. Such currents are the mechanism for power dissipation in transmission lines at RF frequencies (e.g., 3 KHz through 300 GHz). Because a 2DEG of high sheet conductivity is readily achieved in group III-N systems (e.g., gallium nitride, or GaN), it can be used as a conductive ground shield to reduce displacement and eddy currents in silicon substrates. Because of this reduction in dissipation of RF signal power in the substrate, the resulting transmission lines are generally referred to herein as low loss. As will be further appreciated in light of this disclosure, the techniques are particularly helpful in applications employing silicon substrates. Silicon substrates are lossier than semi-insulating substrates that are normally used in RF applications, such as group III-V substrates, silicon carbide (SiC) substrates, and sapphire substrates. As such, silicon substrates are not normally used in such applications.

Figure 3A:
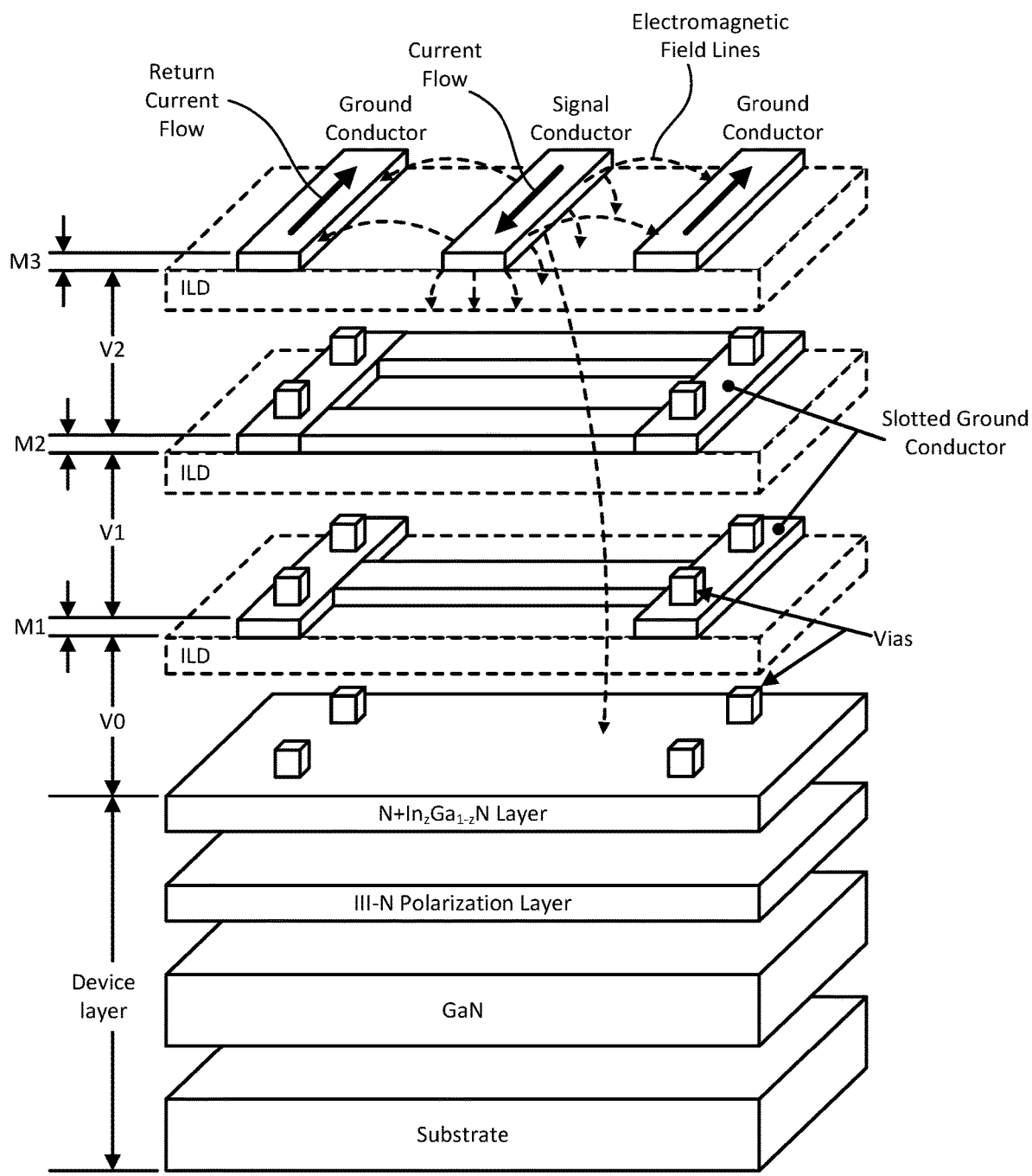
FIG. 3a illustrates an exploded view of the integrated circuit transmission line structure shown in FIG. 2, in the context of a device layer and an interconnect layer, in accordance with an embodiment of the present disclosure.

FIG. 3a illustrates an exploded view of the integrated circuit transmission line structure shown in FIG. 2a, in the context of a device layer and an interconnect, in accordance with an embodiment of the present disclosure. As can be seen in this example use case, the device layer generally includes the substrate, GaN layer, III-N polarization layer, and the n-type doped layer of $In_zGa_{1-z}N$, while the interconnect layer generally includes the vias, ILDs, and ground/signal conductors arranged in alternating via layers V0 through V3 and metal layers M1 through M3. Via layer V0 is implemented in the first ILD. Metal layer M1 is implemented on the first ILD and is conductively coupled to the vias V0 through the first ILD. Via layer V1 is implemented in the second ILD. Metal layer M2 is implemented on the second ILD and is conductively coupled to the V1 vias through the second ILD. Via layer V2 is implemented in the third ILD. Metal layer M3 is implemented on the third ILD and is conductively coupled to the V2 vias through the third ILD. Although three ILDs are shown in this example embodiment, other such embodiments can have any number of ILD (e.g., 1 or more).

Figure 3B:
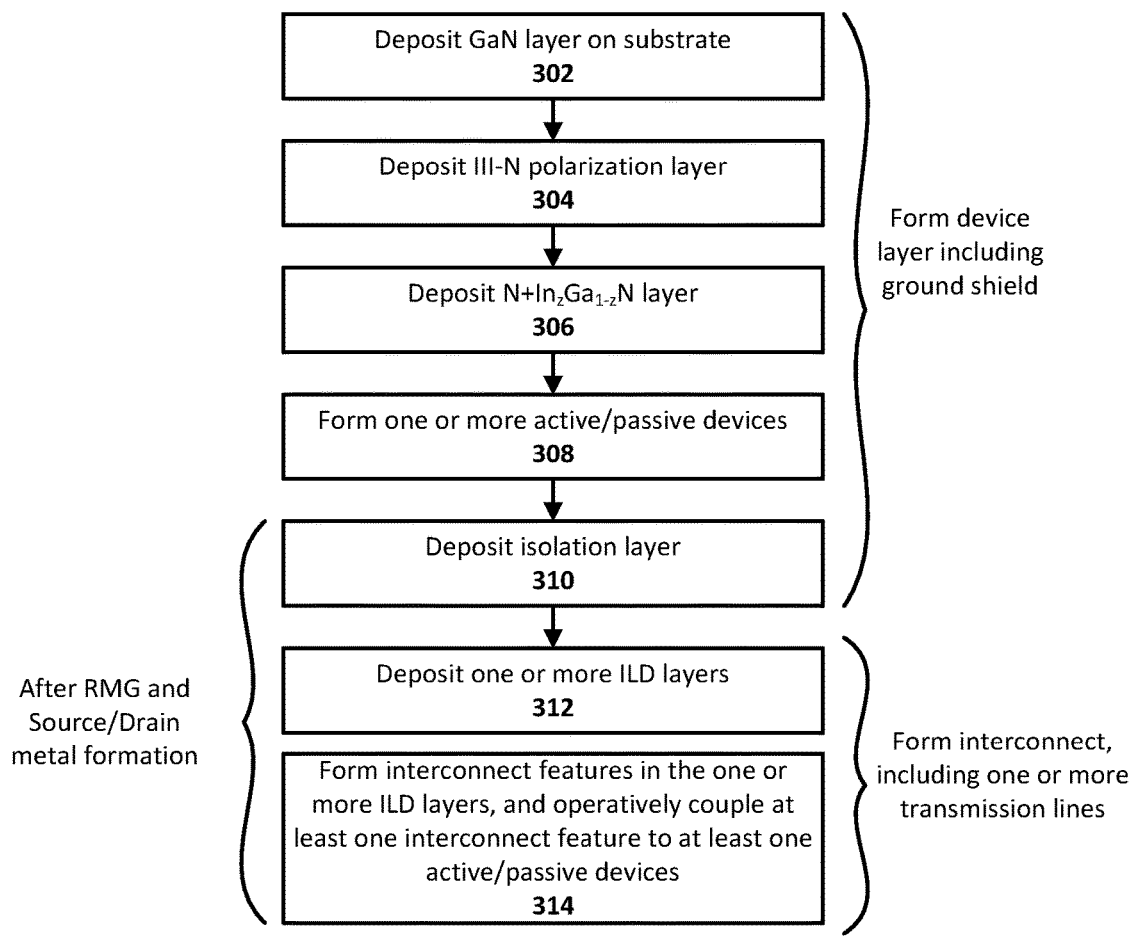
FIG. 3b illustrates a method for forming an integrated circuit transmission line structure, in accordance with an embodiment of the present disclosure.

FIG. 3b illustrates a method for forming an integrated circuit transmission line structure, in accordance with an embodiment of the present disclosure. As can be seen, the method generally includes processing to form a device layer including a transmission line ground shield in at least some locations, and processing to form an interconnect including one or more transmission lines. The various layers can be provided using deposition techniques such as, for example, metal-organic chemical vapor deposition (MOCVD), molecular-beam epitaxy (MBE), chemical vapor deposition (CVD), atomic layer deposition (ALD), physical vapor deposition (PVD), and/or any other suitable process as will be apparent in light of this disclosure. The depositions can be carried out in a blanket or selective fashion, depending on factors such as desired number of masking and etching steps to provide the desired particulars of a layer. Further note that the steps of the method need not be performed in the specific order depicted. For instance, in some embodiments, the deposition at 306 can be performed during step 308 rather than before step 308. Likewise, the deposition at 310 can be performed during step 308 rather than after step 308. Numerous such variations will be apparent in light of this disclosure.

The method of this example case includes depositing 302 a GaN layer on a substrate. Although any number of suitable substrates can be used, in one example embodiment, the substrate is a silicon bulk substrate or a silicon layer provided on some underlying substrate structure. The GaN layer can be provided directly on the substrate or otherwise over the substrate with one or more intervening layers. Moreover, note that the GaN layer need not be a continuous blanket type deposition, but may be islanded in some cases, for instance. For example, in some embodiments, the GaN layer at 302 may be formed by patterning shallow trench isolation (STI) material on the substrate and depositing GaN using lateral epitaxial overgrowth processing, sometimes called LEO (lateral epitaxial overgrowth) or ELO (epitaxial lateral overgrowth). In other example cases, the GaN layer is blanket deposited directly on the substrate. In still other example cases, an intervening set of one or more buffer layers is provided to ease lattice matching constraints between the GaN layer and underlying substrate.

The method further includes depositing 304 a III-N polarization layer over the GaN layer, and then depositing 306 the n-doped $In_zGa_{1-z}N$ layer. As previously explained, the III-N polarization layer can be used to induce 2DEG in a GaN channel layer, and the n-doped $In_zGa_{1-z}N$ layer can be used to further decrease the conductivity of that 2DEG. Further note, that in some embodiments, one or more intervening layers may be provided between the GaN layer and the III-V polarization layer, and/or between the III-V polarization layer and the n-doped $In_zGa_{1-z}N$ layer, to provide a desired strain or lattice matching scheme. In addition, either or both of these layers at 304 and 306 can be selectively deposited at certain locations or blanket deposited. In selective deposition, masking can be used where needed to isolate areas of interest where the material is to be deposited. The masking can then be etched off as needed. In blanket depositions, masking and etching can similarly be used where needed to remove extraneous material.

The method further includes forming 308 one or more active devices and/or passive devices. As previously explained, the depositions at 304 and/or 306 can be carried out during 308. For example, in one example embodiment, the n-type doped $In_zGa_{1-z}N$ layer of 306 is deposited during a source/drain regrowth process for a transistor being formed in the device layer. So, in one such case, the polarization layer can be provided on the GaN layer, and then a sacrificial gate stack can be formed over the channel region, and then the source drain regions can be regrown or otherwise formed to either side of the channel. A replacement metal gate process (RMG) process can also be performed, wherein sacrificial gate stack materials are removed and replaced with more desirable gate materials such as a high-k gate dielectric (e.g., hafnium oxide or other suitable high-k material) and high conductivity gate metal (e.g., tungsten or other suitable gate metal). In any such cases, note that the n-type doped $In_zGa_{1-z}N$ layer can be used for both transmission line ground shielding in some locations and source/drain regions in other locations. In one such case, one or more masking steps can be formed before the n-type doped $In_zGa_{1-z}N$ layer regrowth process, so as to facilitate selectively forming the n-type doped $In_zGa_{1-z}N$ layer in only desired S/D regions and transmission shield areas. Thus, no etching of the selectively provided n-type doped $In_zGa_{1-z}N$ layer is needed.

After RMG processing and source/drain metal formation, the method further includes forming the interconnect which includes depositing 310 an isolation layer. The isolation layer can be implemented, for example, with materials similar to the ILD materials such as oxides or nitrides or any other suitable insulator materials capable of providing the desired electrical isolation between components of the device layer, or as otherwise needed for a given integrated circuit device layer layout. In one embodiment, the isolation layer is implemented with an oxide (e.g., silicon dioxide) layer having a thickness of 200 nm or thicker. Note that such an isolation oxide layer can be used to not only isolate (shield) the transmission line signal conductor from the substrate, but also to reduce the parasitic capacitance. In one example embodiment, before the isolation oxide is deposited, the polarization layer is etched off in locations where the isolation oxide is desired (e.g., between transistor cell regions, or other isolation areas). In some such cases, the n-type doped $In_zGa_{1-z}N$ layer can be regrown or otherwise formed after the deposition of the isolation oxide to provide source/drain regions in some locations and transmission line ground shielding in still other locations, as previously explained.

The method further includes forming 312 one or more ILD layers and forming 314 one or more interconnect features in the one or more ILD layers, and operatively coupling at least one interconnect feature to at least one of the active/passive devices formed in the device layer. For instance, in one example case having a GaN transistor formed in the device layer, the signal conductor is connected to the source or drain of the GaN and the ground conductor is connected to the gate (common gate amplifier configuration). In another example case having a GaN transistor formed in the device layer, the signal conductor is connected to the gate or drain of the GaN and the ground conductor is connected to the source (common source amplifier configuration). Numerous possible configurations can be used here, as will be appreciated.

Figure 3C:
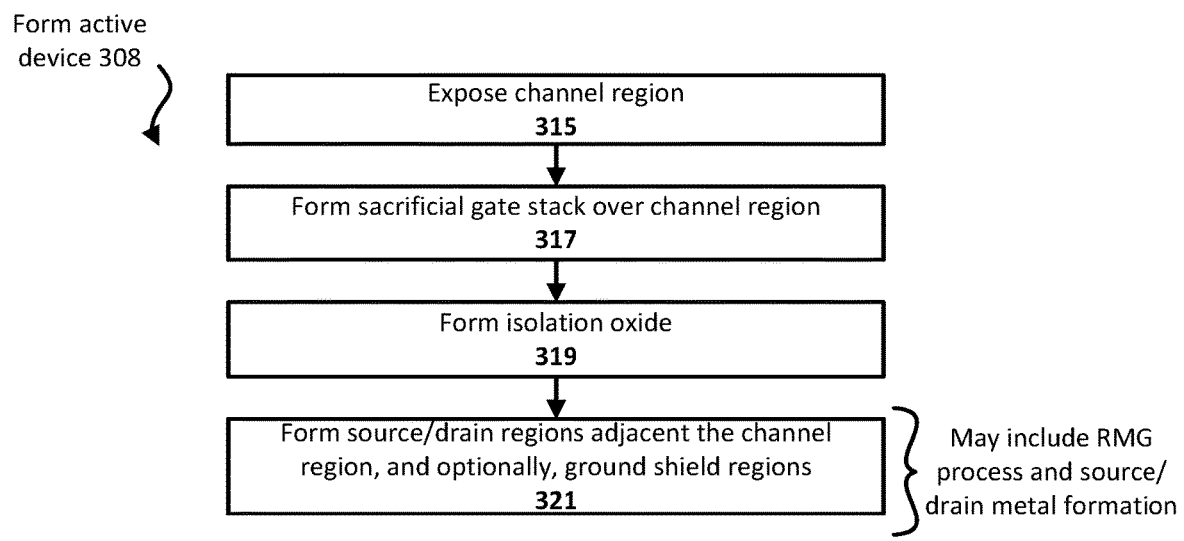
FIG. 3c further illustrates a device forming process within the context of the method shown in FIG. 3b, in accordance with an embodiment of the present disclosure.

FIG. 3c further illustrates a device forming process at 308 within the context of the method shown in FIG. 3b, in accordance with an embodiment of the present disclosure. As can be seen, the method includes exposing 315 a channel region in the GaN layer, and forming 317 a sacrificial gate stack over the channel region. The sacrificial gate stack includes, for example, sacrificial gate materials such as a silicon dioxide gate dielectric and a polysilicon gate metal. At 321, note that such as sacrificial gate stack can be replaced during an RMG process with, for example, a high-k gate dielectric and a gate metal. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name a few examples. Example gate metals include tungsten, aluminum, titanium, silver, nickel, and alloys thereof, to name a few examples. Source and drain metal formation may also be carried out at this time, to provide source/drain contacts in some cases.

The method further includes forming 319 an isolation oxide, which can be used between transistors of the device layer and/or between the gate and source/drain regions of a single transistor, as is sometimes done. As will be appreciated, this step 319 may be step 310 of the process shown in FIG. 3b. In one embodiment, before the isolation oxide is deposited, the polarization layer is etched off in those locations. The method further includes forming 321 the source/drain regions adjacent the channel region. Recall, in some embodiments, that this source/drain regions forming at 321 includes depositing an n-type doped $In_zGa_{1-z}N$ layer after the deposition of the isolation oxide at 319 to provide source/drain regions in some locations and transmission line ground shielding in still other locations.

Figure 3D:
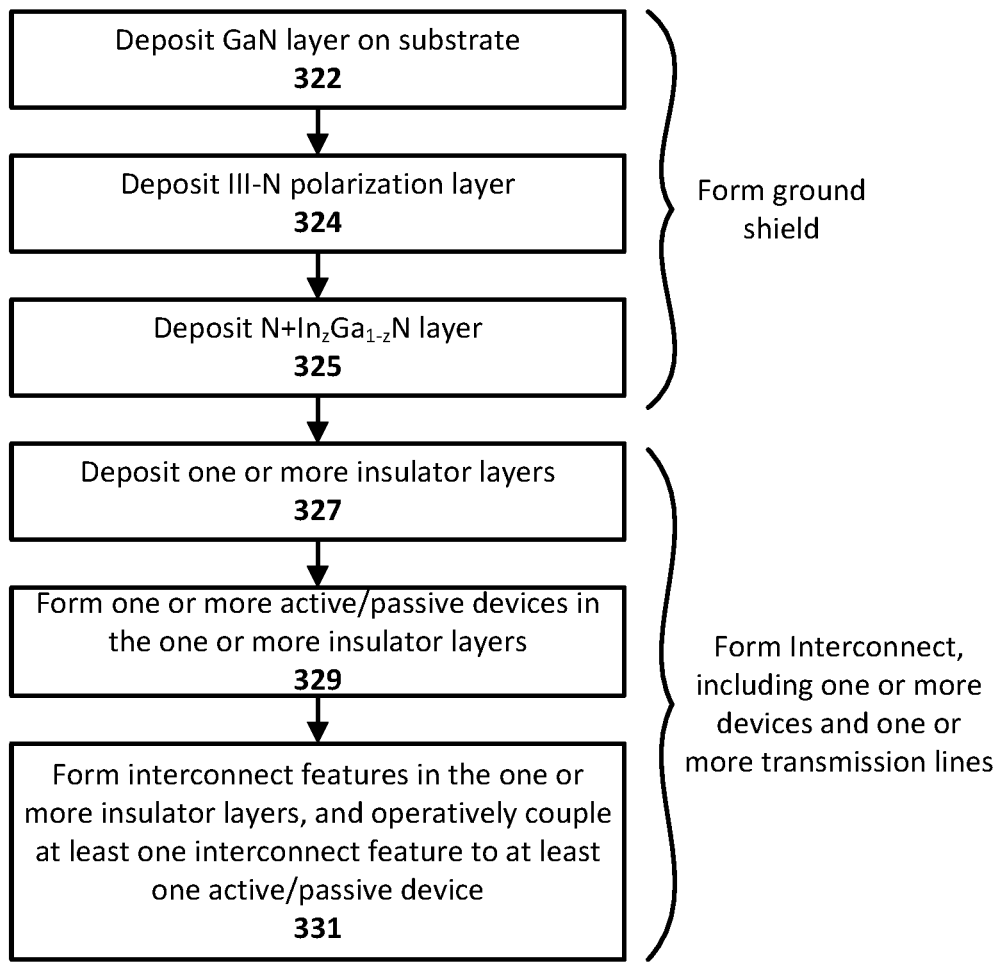
FIG. 3d illustrates a method for forming an integrated circuit transmission line structure, in accordance with another embodiment of the present disclosure.

FIG. 3d illustrates a method for forming an integrated circuit transmission line structure, in accordance with another embodiment of the present disclosure. In this example case, there is no device layer per se. Rather, one or more active and/or passive devices are formed within the interconnect layer. As can be seen, the method generally includes a ground shield forming portion and an interconnect forming portion, wherein the interconnect includes one or more transmission lines connected to one or more components. Many variations will be apparent.

The method includes depositing 322 a GaN layer on a silicon or other suitable substrate, depositing 324 a III-N polarization layer over the GaN layer, and depositing 325 the $N+In_zGa_{1-z}N$ layer over the III-N polarization layer, so as to form a transmission line ground shield. The previous relevant discussion on each of these layers is equally applicable here. Note that in other embodiments, the transmission line ground shield may include the III-N polarization layer over a GaN layer, with no $N+In_zGa_{1-z}N$ layer.

The method further includes depositing 327 one or more insulator layers, forming 329 one or more active/passive devices in the one or more insulator layers, and forming 331 interconnect features in the one or more insulator layers, and operatively coupling at least one interconnect feature to at least one active/passive device. The insulator layers can be ILD layers, and in some example embodiments the component is a trench based capacitor formed in a via structure of one ILD layer. In another example case the component is a back-end signal amplifier. Numerous other component configurations will be apparent in light of this disclosure.

In one specific embodiment implemented using MOCVD, a 2DEG was provided in GaN using an $Al_{0.83}In_{0.17}N$ polarization layer. The polarization layer had a thickness in the range of 8 nm to 12 nm, and a sheet resistance of 220 ohms/square. In addition, an n-doped $In_zGa_{1-z}N$ layer was provided on the 2DEG and implemented with z equal to 0.1 to yield a layer of $N+In_{0.1}Ga_{0.9}N$. This n-doped layer had a thickness up to 200 nm, and a sheet resistance of about 25 ohm/sq. Numerous other specific configurations can be used, as will be appreciated, wherein a ground conductor of a given transmission line configurations is shielded from an underlying substrate by electrically coupling that ground conductor to an intervening III-N ground shield such as the III-N polarization layer or the even more conductive n-doped $In_zGa_{1-z}N$ layer.

Example Use Cases

A number of use cases are shown in FIGS. 4a through 5d. The use cases are merely intended to show example configurations and are not intended to limit the present disclosure to the configurations shown. Rather, numerous other such configurations can be used as well, wherein a III-V polarization layer and/or an n-doped $In_zGa_{1-z}N$ layer are used to, amount other possible things, provide transmission line ground shielding, as will be appreciated in light of this disclosure.

Figure 4A:
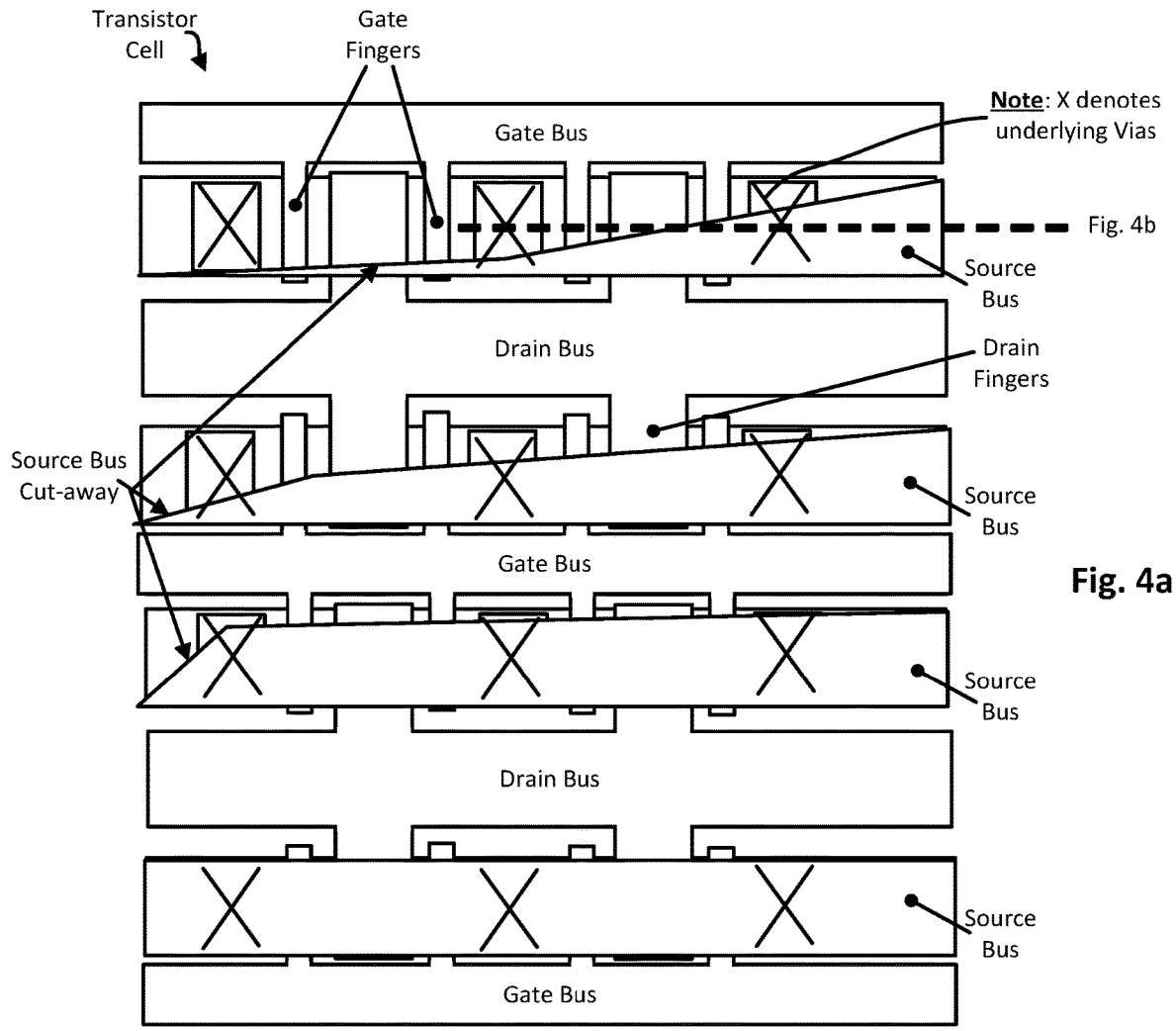
FIGS. 4a-4b illustrate top down and cross-section partial views, respectively, of a transistor cell configured in accordance with another embodiment of the present disclosure.
Figure 4B:
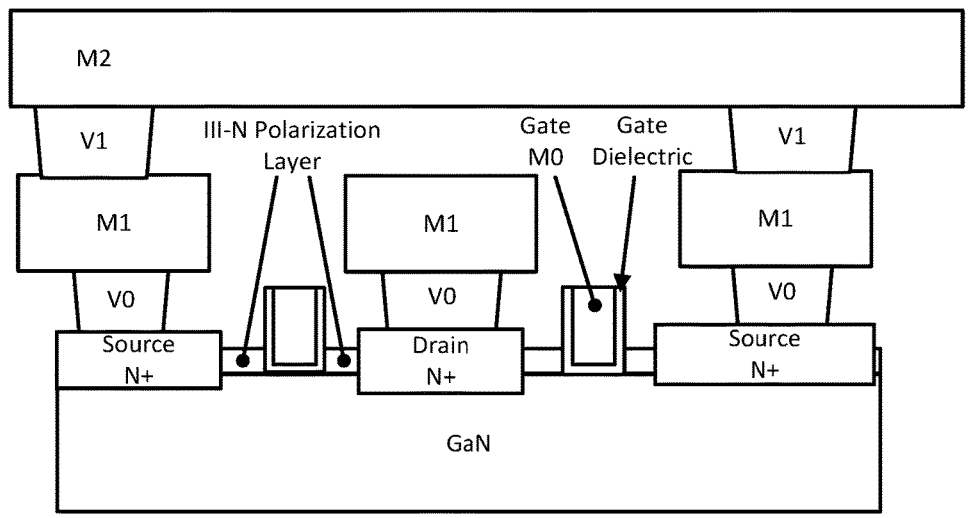

FIG. 4a illustrates a top down partial view of a transistor cell configured in accordance with another embodiment of the present disclosure. As can be seen, the transistor cell generally includes a gate bus, a drain bus, and a source bus (shown in cut-away, so that features under the source bus can be seen). Further note that X depict underlying vias. FIG. 4b illustrates a cross-section partial side view of the transistor cell shown in FIG. 4a, taken at the 4b dashed line which generally runs parallel to and through one of the source buses. As can be seen, N+ source and drain regions are formed on a GaN layer to either side of a gate stack that includes a gate dielectric and a gate metal (M0). The polarization layer between the source/drain regions and the gate induce a 2DEG in the GaN channel underneath the gate. Here, no transmission line ground shielding is needed (i.e., there is no transmission line to shield in this particular cross-section), but note that the source/drain N+ regions can be implemented with n-doped $In_zGa_{1-z}N$ layer (which can also provide shielding, when deposited in other locations). Likewise, so can the III-N polarization layer.

Figure 5A:
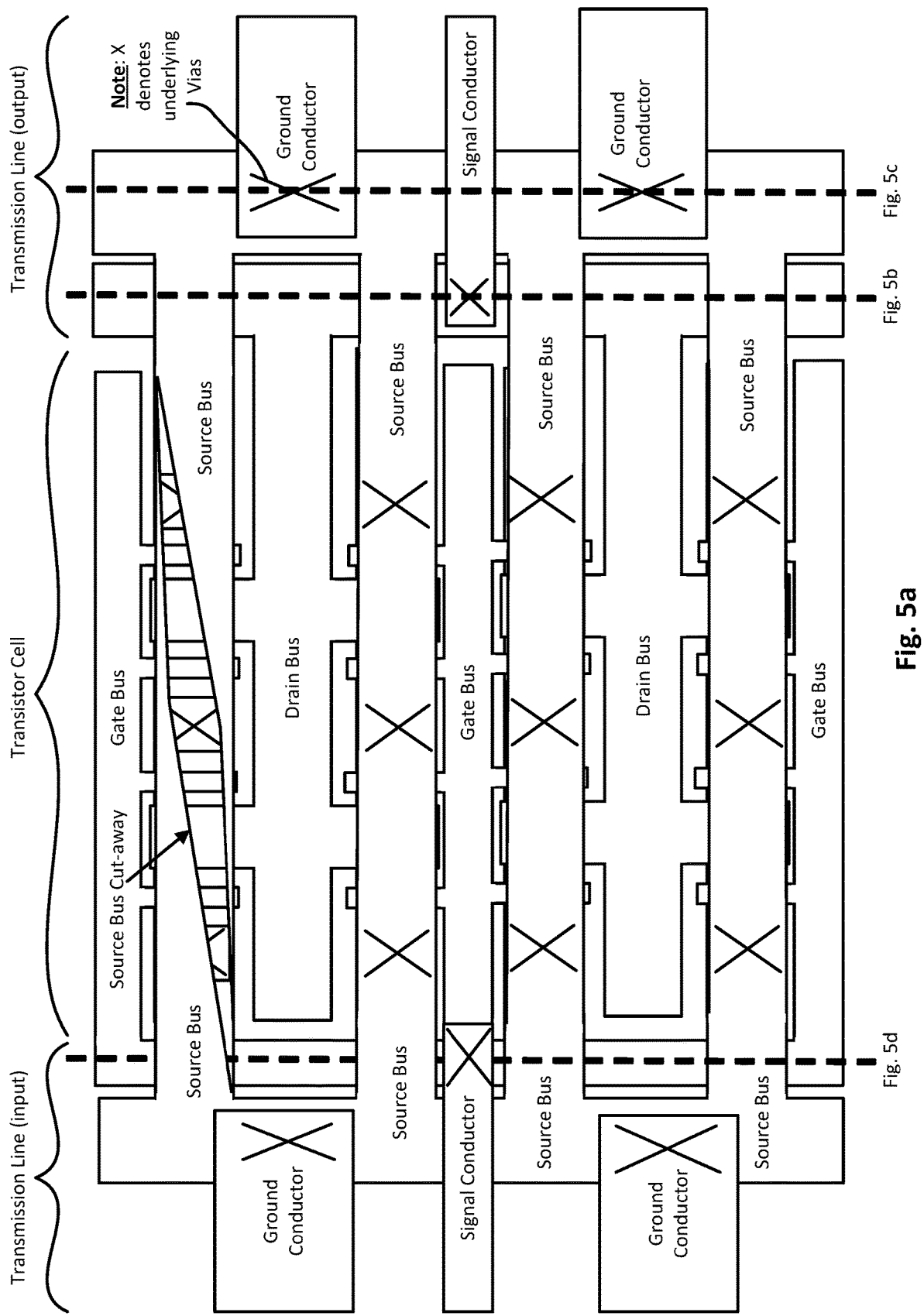
FIG. 5a illustrates a top down partial view of a transistor cell and transmission line structure, configured in accordance with another embodiment of the present disclosure.

FIG. 5a illustrates top down partial view of a transistor cell and transmission line structure, configured in accordance with another embodiment of the present disclosure. As can be seen, the transistor cell is similar to that shown in FIGS. 4a-b. However, each of the source, gate, and drain buses has been further extended to either side of the transistor cell. In addition, a signal conductor of one transmission line is connected to the source bus, and two co-planar ground conductors to either side of the signal conductor are connected to the source bus. This transmission line provides the input side of a common source amplifier. In addition, on the other side of the structure, a signal conductor of second transmission line is connected to the drain bus, and two co-planar ground conductors to either side of the signal conductor are connected to the source bus. This transmission line provides the output side of a common source amplifier.

Figure 5B:
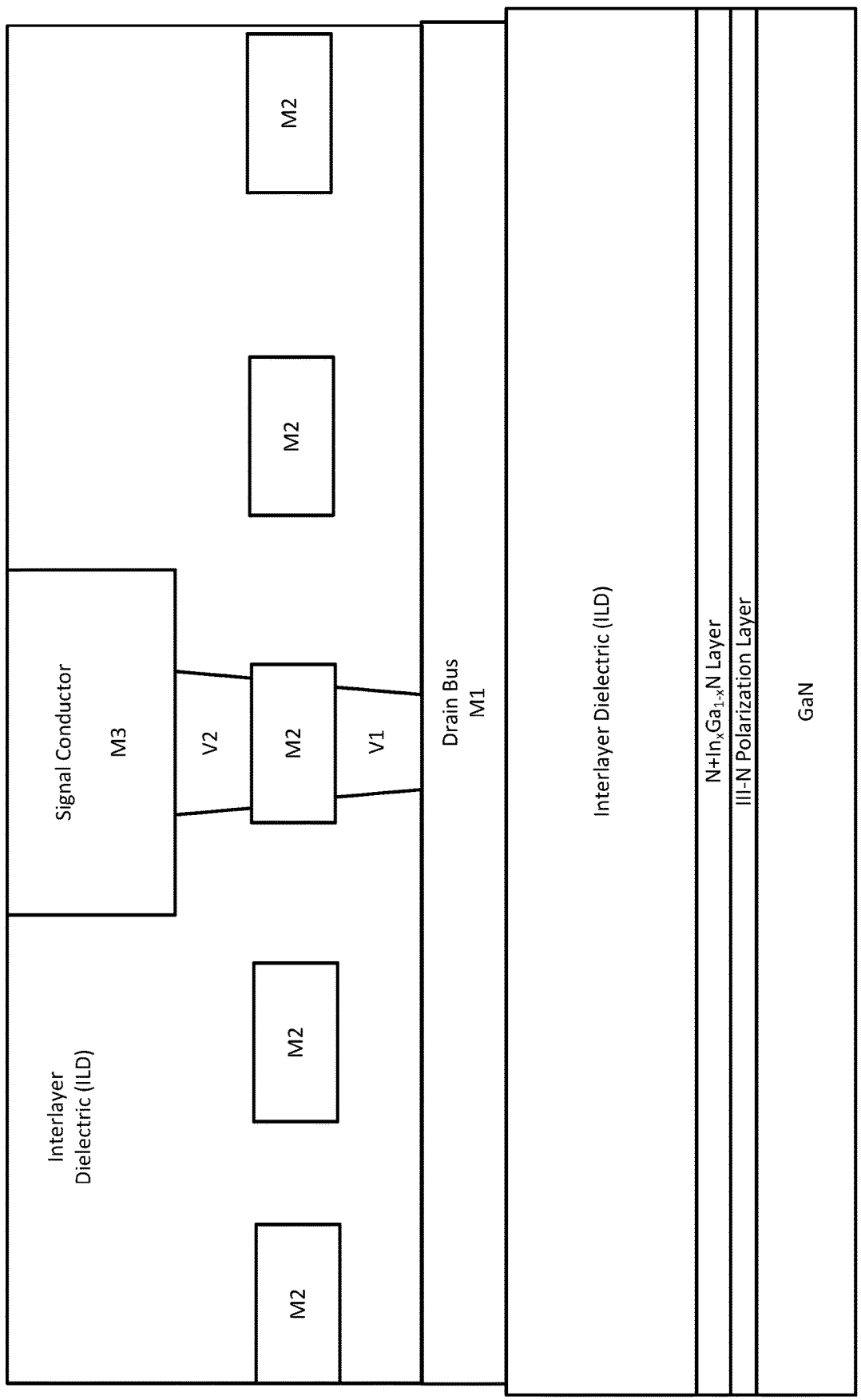
FIG. 5b illustrates a cross-section partial view of the structure shown in FIG. 5a, taken at the 5b dashed line, and configured in accordance with another embodiment of the present disclosure.

FIG. 5b illustrates cross-section partial view of the structure shown in FIG. 5a, taken at the 5b dashed line, and configured in accordance with another embodiment of the present disclosure. This cross-section shows the connectivity of the signal conductor to the drain bus on the output side of the transmission line. As can be seen in this cross-section of the example embodiment, the signal conductor is in the M3 layer of the ILD and is connected to the drain bus by way of via V2, metal layer M2, and via V1. Further note that the underlying n-doped $In_zGa_{1-z}N$ layer and the III-N polarization layer provide ground shielding between the signal conductor of layer M3 and the substrate (not shown, but generally under the GaN layer). Further note that ground shielding could also be provided by the n-doped $In_zGa_{1-z}N$ layer only (without the III-N polarization layer being present) in some embodiments, or alternatively by the III-N polarization layer only (without the n-doped $In_zGa_{1-z}N$ layer being present), in still other embodiments. Further note this example shows two distinct ILD layers, but other embodiments may include any number of ILDs making up the overall structure, whether one common ILD layer or multiple ILD layers in a stacked configuration.

Figure 5C:
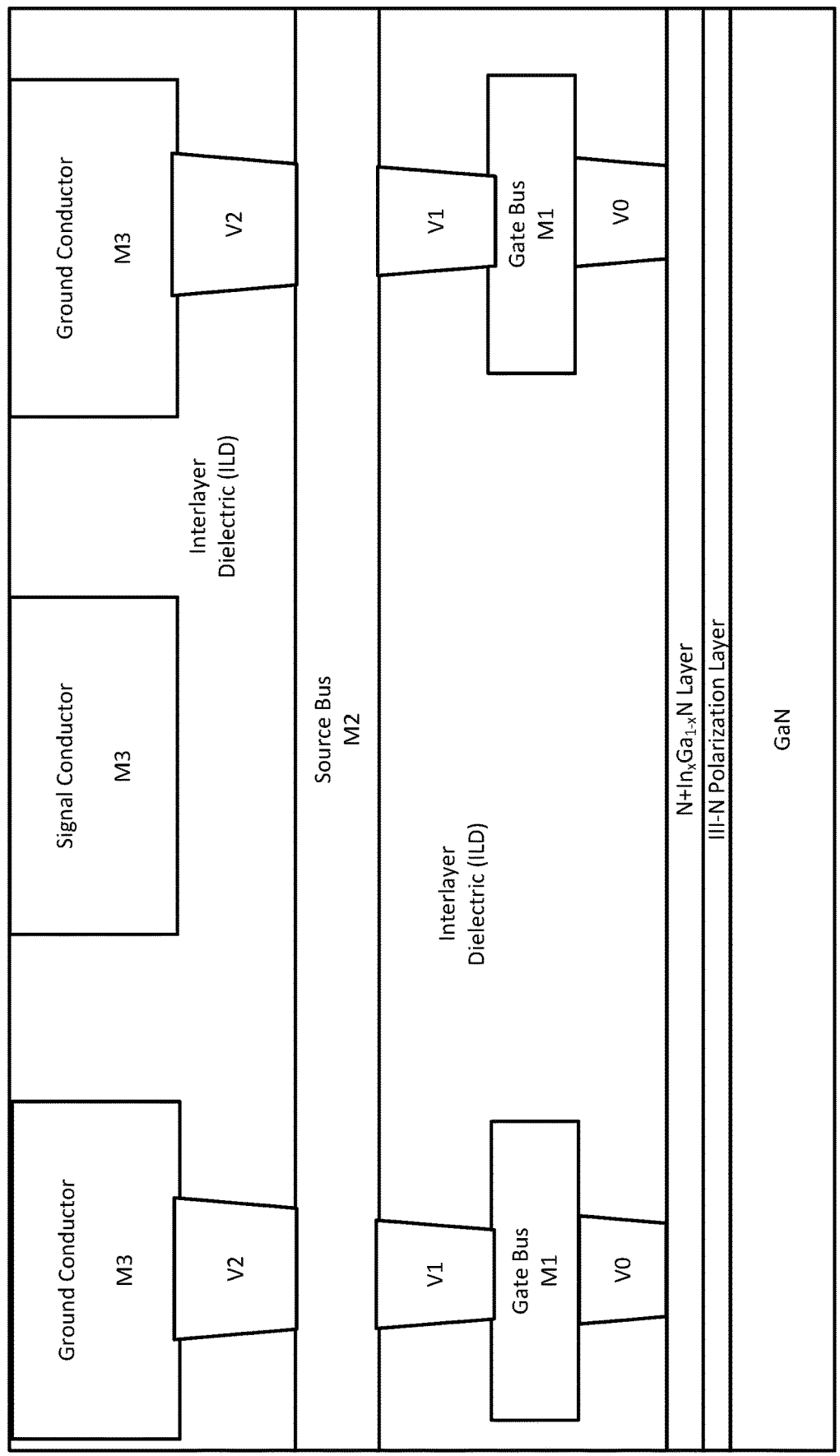
FIG. 5c illustrates a cross-section partial view of the structure shown in FIG. 5a, taken at the 5c dashed line, and configured in accordance with another embodiment of the present disclosure.

FIG. 5c illustrates cross-section partial view of the structure shown in FIG. 5a, taken at the 5c dashed line, and configured in accordance with another embodiment of the present disclosure. This cross-section shows the connectivity of the ground conductors to the source bus on the output side of the transmission line. As can be seen in this cross-section, the signal conductor is in the M3 layer of the ILD and is not connected to anything. However, the ground conductors, which are also in the M3 layer of this example embodiment, are each connected to the source bus in the M2 layer by way of via V2, and further connected to the ground shield provided by the underlying the n-doped $In_zGa_{1-z}N$ layer. Further note that any number of ILDs can make up the overall structure, as previously explained.

Figure 5D:
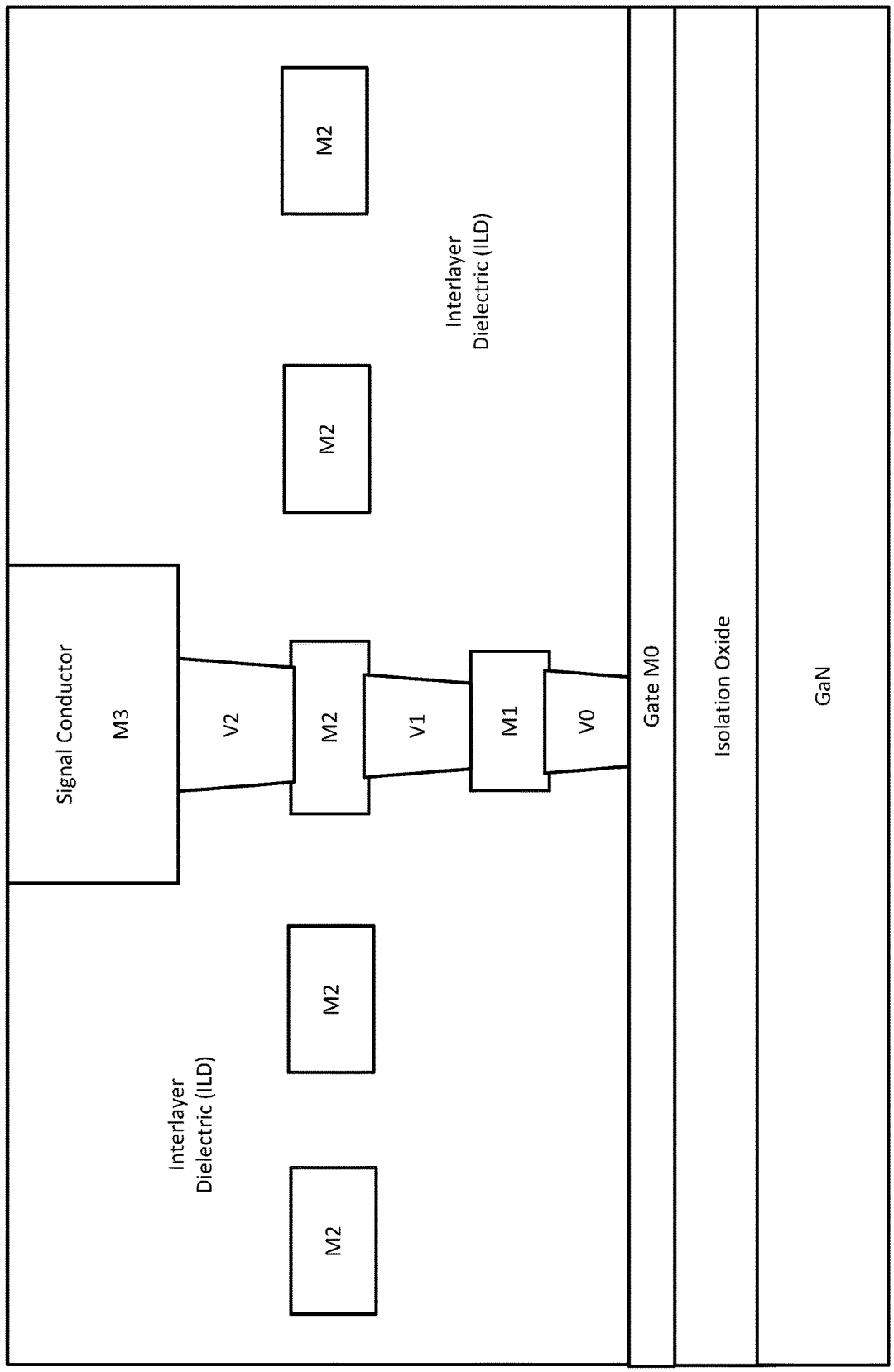
FIG. 5d illustrates a cross-section partial view of the structure shown in FIG. 5a, taken at the 5d dashed line, and configured in accordance with another embodiment of the present disclosure.

FIG. 5d illustrates cross-section partial view of the structure shown in FIG. 5a, taken at the 5d dashed line, and configured in accordance with another embodiment of the present disclosure. This cross-section shows the connectivity of the signal conductor to the gate bus on the input side of the transmission line. As can be seen in this cross-section of the example embodiment, the signal conductor is in the M3 layer of the ILD and is connected to the gate bus in the M0 layer by way of via V2, metal layer M2, via V1, metal layer M1, and via V0. As previously discussed, the ground shielding is provided by the n-doped $In_zGa_{1-z}N$ layer, but alternatively could be provided by the III-N polarization layer in other embodiments. Further note that any number of ILDs can make up the overall structure, as previously explained.

Example System

Figure 6:
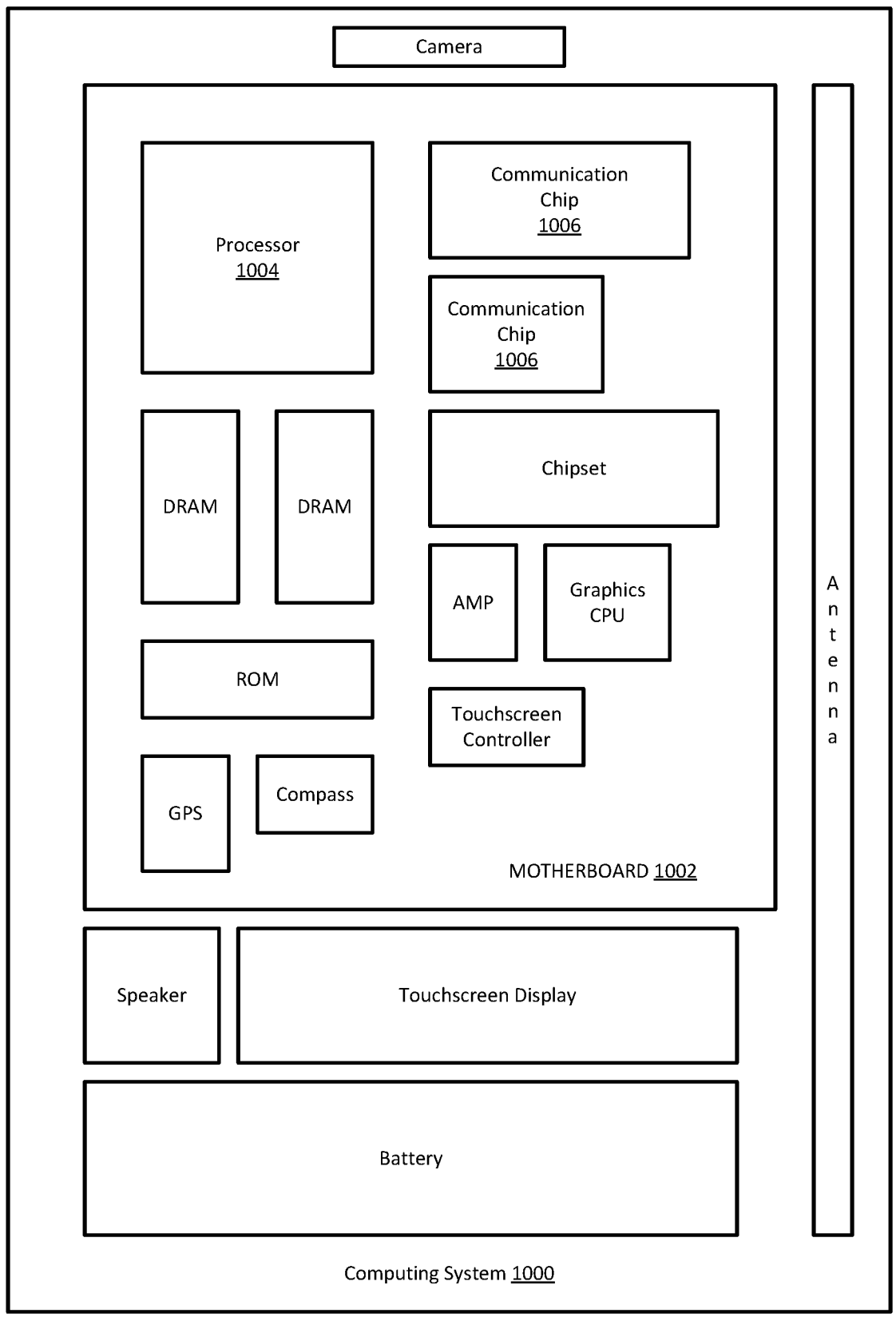
FIG. 6 illustrates an example computing system that may employ one or more integrated circuit structures configured in accordance with another embodiment of the present disclosure.

FIG. 6 illustrates an example computing system 1000 that may employ one or more integrated circuit structures configured in accordance with another embodiment of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, RRAM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more transmission lines shielded by one or more III-N layers as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., III-N shielded transmission lines) as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., III-N shielded transmission lines) as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., III-N shielded transmission lines) configured as variously described herein.

Many other embodiments and applications for the techniques provided herein will be apparent. For example, the techniques can be embodied in any number of RF integrated circuits, wireless communications integrated circuits, microelectromechanical systems (MEMS) integrated circuits, and power integrated circuits, and other such circuits that utilize RF filters, amplifiers, switches or those used in high frequency applications such as base stations, receivers, transmitters, transceivers, to name a few examples. As will be further appreciated, the techniques can be used, for example, for 5G communications and future generations of mobile technology, although numerous other applications will also be apparent.

Further Example Embodiments

The following examples pertain to further embodiments, from which numerous permutations and configurations will be apparent.

Example 1 is an integrated circuit, comprising: a substrate; a gallium nitride layer over the substrate; a ground shield over the substrate; and a transmission line over the ground shield and including a signal conductor and at least one ground conductor, the at least one ground conductor electrically connected to the ground shield. The ground shield includes least one of: a polarization layer comprising a group III-N compound; and an n-type doped layer of $In_zGa_{1-z}N$, wherein In is indium, Ga is gallium, N is nitrogen, and z is in the range of 0.0 to 1.0.

Example 2 includes the subject matter of Example 1, and further includes at least one dielectric layer between the transmission line and the ground shield. In some example cases, there are dielectric layers or structures, such as, for example, ILD layers 1-9 or some other ILD stack.

Example 3 includes the subject matter of Example 1 or 2, wherein the substrate is a bulk silicon substrate.

Example 4 includes the subject matter of any of the preceding Examples, wherein the gallium nitride layer includes a channel region, and the polarization layer is configured to induce formation of two-dimensional electron gas (2DEG) in the channel region.

Example 5 includes the subject matter of any of the preceding Examples, wherein the polarization layer has a thickness between its top and bottom surfaces, the thickness in the range of 2 nm to 30 nm.

Example 6 includes the subject matter of any of the preceding Examples, wherein the polarization layer is or otherwise includes $Al_{0.83}In_{0.17}N$, wherein Al is aluminum, In is indium, and N is nitrogen.

Example 7 includes the subject matter of any of the preceding Examples, wherein the polarization layer is or otherwise includes $Al_xIn_{1-x}N$, wherein Al is aluminum, In is indium, N is nitrogen, and x is in the range of greater than 0.83 up to and including 1.0.

Example 8 includes the subject matter of Example 7, wherein x equals 1.0 such that the polarization layer is or otherwise includes AlN, and the polarization layer has a thickness between its top and bottom surfaces, the thickness in the range of 1 nm to 5 nm.

Example 9 includes the subject matter of any of the preceding Examples, wherein the polarization layer is or otherwise includes $Al_xGa_{1-x}N$, wherein Al is aluminum, Ga is gallium, N is nitrogen, and x is in the range of greater than 0.1 up to and including 0.5.

Example 10 includes the subject matter of Example 9, wherein x is in the range of 0.35 to 0.5, and the polarization layer has a thickness between its top and bottom surfaces, the thickness in the range of 1 nm to 10 nm.

Example 11 includes the subject matter of any of the preceding Examples, wherein the polarization layer is or otherwise includes $Al_xIn_yGa_{1-x-y}N$, wherein Al is aluminum, In is indium, Ga is gallium, N is nitrogen, x is in the range of 0.9 to 1.0, and y is in the range of 0.05 to 0.1.

Example 12 includes the subject matter of any of Examples 6 through 11, wherein the gallium nitride layer includes a GaN transistor channel region, and the polarization layer is configured to induce formation of two-dimensional electron gas (2DEG) in the channel region.

Example 13 includes the subject matter of any of the preceding Examples, wherein the polarization layer is or otherwise includes $In_xGa_{1-x}N$, wherein In is indium, Ga is gallium, N is nitrogen, and x is in the range of 0.05 to 0.2.

Example 14 includes the subject matter of any of the preceding Examples, wherein the n-type doped layer of $In_zGa_{1-z}N$ has a dopant concentration in the range of $1 \times 10^{18}$ to $1 \times 10^{21}$ atoms/$cm^3$.

Example 15 includes the subject matter of Example 14, wherein the dopant concentration is in the range of $5 \times 10^{19}$ to $3 \times 10^{20}$ atoms/$cm^3$.

Example 16 includes the subject matter of any of the preceding Examples, wherein the n-type doped layer of $In_zGa_{1-z}N$ is doped with silicon.

Example 17 includes the subject matter of any of the preceding Examples, wherein the n-type doped layer of $In_zGa_{1-z}N$ is doped with germanium. Other dopants will be appreciated, such as SiGe.

Example 18 includes the subject matter of any of the preceding Examples, wherein z is in the range of 0.05 to 0.2.

Example 19 includes the subject matter of any of the preceding Examples, wherein z is 0.0 such that the n-type doped layer of $In_zGa_{1-z}N$ is or otherwise includes GaN. Note that such doped GaN is distinct from and in addition to the gallium nitride layer over the substrate.

Example 20 includes the subject matter of any of the preceding Examples, wherein z is 1.0 such that the n-type doped layer of $In_zGa_{1-z}N$ is or otherwise includes InN.

Example 21 includes the subject matter of any of the preceding Examples, wherein the n-type doped layer of $In_zGa_{1-z}N$ has a thickness between its top and bottom surfaces, the thickness in the range of 20 nm to 2 microns.

Example 22 includes the subject matter of any of the preceding Examples, wherein the n-type doped layer of $In_zGa_{1-z}N$ has a thickness between its top and bottom surfaces, the thickness in the range of 20 nm to 200 nm.

Example 23 includes the subject matter of any of the preceding Examples, wherein the signal conductor of the transmission line is connected to a passive component, the passive component including at least one of a resistor, an inductor, and a capacitor. In some cases, the passive component may be part of a filter circuit. The filter circuit may be, for example, an active filter or a passive filter.

Example 24 includes the subject matter of any of the preceding Examples, wherein the signal conductor of the transmission line is connected to a transistor. The transistor can be, for example, part of an amplifier circuit or a switching circuit.

Example 25 includes the subject matter of any of the preceding Examples, wherein the transistor is a gallium nitride transistor including at least part of the gallium nitride layer, and the transistor further includes source and drain regions adjacent the channel region, each of the source and drain regions including n-type doped $In_zGa_{1-z}N$.

Example 26 includes the subject matter of Example 24 or 25, wherein the transistor is configured as a common source amplifier.

Example 27 includes the subject matter of Example 24 or 25, wherein the transistor is configured as a common gate amplifier.

Example 28 includes the subject matter of Example 24 or 25, wherein the transistor is configured as a common drain amplifier.

Example 29 includes the subject matter of Example 24 or 25, wherein the transistor is configured as a cascode amplifier.

Example 30 includes the subject matter of Example 24 or 25, wherein the transistor is configured as a stacked amplifier. In some such cases, the stack amplifier includes a plurality of transistors connected in a parallel or serial or combination parallel-serial arrangement, to provide a stacked transistor configuration.

Example 31 includes the subject matter of any of the preceding Examples, wherein the integrated circuit is part of a system-on-chip (SOC) comprising a radio frequency (RF) circuit. The SOC may be, for example, part of a chip set. The SOC may be configured as an RF front end or receiver, having one or more amplifier and/or filter stages for processing high frequency signals.

Example 32 is a computing device that includes the subject matter of any of the preceding Examples. The computing device may be, for example, a laptop, a tablet, a smartphone, game console, or a desktop computer.

Example 33 is an integrated circuit, comprising: a bulk silicon substrate; a gallium nitride layer over the substrate and including a channel region; a ground shield over the substrate; a transmission line over the ground shield, the transmission line including a signal conductor and at least one ground conductor, the at least one ground conductor electrically connected to the ground shield; and at least one dielectric layer between the transmission line and the ground shield. The ground shield includes at least one of a polarization layer and an n-type doped layer of $In_zGa_{1-z}N$, wherein In is indium, Ga is gallium, N is nitrogen, and z is in the range of 0.0 to 1.0. The polarization layer comprises a group III-N compound, and is for inducing two-dimensional electron gas (2DEG) in the channel region. The polarization layer has a thickness in a direction orthogonal to the substrate, the thickness in the range of 1 nm to 30 nm. The n-type doped layer of $In_zGa_{1-z}N$ has a dopant concentration in the range of $1\times10^{18}$ to $1\times10^{21}$ atoms/cm$^3$. The n-type doped layer of $In_zGa_{1-z}N$ has a thickness in a direction orthogonal to the substrate, the thickness in the range of 20 nm to 2 microns.

Example 34 includes the subject matter of Example 33, wherein the polarization layer is $Al_{0.83}In_{0.17}N$, wherein Al is aluminum, In is indium, and N is nitrogen.

Example 35 includes the subject matter of Example 33 or 34, wherein the polarization layer is $Al_xIn_{1-x}N$, wherein Al is aluminum, In is indium, N is nitrogen, and x is in the range of greater than 0.83 up to and including 1.0.

Example 36 includes the subject matter of Example 35, wherein x equals 1.0 such that the polarization layer is AlN, and the thickness of the polarization layer is in the range of 1 nm to 5 nm.

Example 37 includes the subject matter of any of Examples 33 through 36, wherein the polarization layer is $Al_xGa_{1-x}N$, wherein Al is aluminum, Ga is gallium, N is nitrogen, and x is in the range of greater than 0.1 up to and including 0.5.

Example 38 includes the subject matter of Example 37, wherein x is in the range of 0.35 to 0.5, and the thickness of the polarization layer is in the range of 1 nm to 10 nm.

Example 39 includes the subject matter of any of Examples 33 through 38, wherein the polarization layer is $Al_xIn_yGa_{1-x-y}N$, wherein Al is aluminum, In is indium, Ga is gallium, N is nitrogen, x is in the range of 0.9 to 1.0, and y is in the range of 0.05 to 0.1.

Example 40 includes the subject matter of any of Examples 33 through 39, wherein the polarization layer is $In_xGa_{1-x}N$, wherein In is indium, Ga is gallium, N is nitrogen, and x is in the range of 0.05 to 0.2.

Example 41 includes the subject matter of any of Examples 33 through 40, wherein the dopant concentration is in the range of $5\times10^{19}$ to $3\times10^{20}$ atoms/cm$^3$.

Example 42 includes the subject matter of any of Examples 33 through 41, wherein the n-type doped layer of $In_zGa_{1-z}N$ is doped with at least one of silicon and germanium.

Example 43 includes the subject matter of any of Examples 33 through 42, wherein z is in the range of 0.05 to 0.2.

Example 44 includes the subject matter of any of Examples 33 through 43, wherein z is 0.0 such that the n-type doped layer of $In_zGa_{1-z}N$ is GaN. Note that such doped GaN is distinct from and in addition to the gallium nitride layer that includes the channel layer.

Example 45 includes the subject matter of any of Examples 33 through 44, wherein z is 1.0 such that the n-type doped layer of $In_zGa_{1-z}N$ is InN.

Example 46 includes the subject matter of any of Examples 33 through 45, wherein the thickness of the n-type doped layer of $In_zGa_{1-z}N$ is in the range of 20 nm to 200 nm.

Example 47 includes the subject matter of any of Examples 33 through 46, wherein the channel region is part of a transistor, and the transistor further includes source and drain regions adjacent the channel region, each of the source and drain regions including n-type doped $In_zGa_{1-z}N$.

Example 48 includes the subject matter of any of Examples 33 through 47, wherein the integrated circuit is part of a system-on-chip comprising a radio frequency (RF) circuit.

Example 49 is a computing device comprising the subject matter of any of Examples 33 through 48. Any number of stationary or mobile computing platforms will be apparent in light of this disclosure.

Example 50 is a method of forming an integrated circuit. The method includes: forming a gallium nitride layer over a substrate; forming a ground shield over the substrate; forming a transmission line over the ground shield, the transmission line including a signal conductor and at least one ground conductor, the at least one ground conductor electrically connected to the ground shield. The ground shield includes at least one of: a polarization layer comprising a group III-N compound; and an n-type doped layer of $In_zGa_{1-z}N$, wherein In is indium, Ga is gallium, N is nitrogen, and z is in the range of 0.0 to 1.0.

Example 51 includes the subject matter of Example 50, and further includes forming at least one dielectric layer between the transmission line and the ground shield.

Example 52 includes the subject matter of Example 50 or 51, wherein the polarization layer has a thickness between its top and bottom surfaces, the thickness in the range of 2 nm to 30 nm.

Example 53 includes the subject matter of any of Examples 50 through 52, wherein the polarization layer is or otherwise includes $Al_{0.83}In_{0.17}N$, wherein Al is aluminum, In is indium, and N is nitrogen.

Example 54 includes the subject matter of any of Examples 50 through 53, wherein the polarization layer is or otherwise includes $Al_xIn_{1-x}N$, wherein Al is aluminum, In is indium, N is nitrogen, and x is in the range of greater than 0.83 up to and including 1.0.

Example 55 includes the subject matter of Example 54, wherein x equals 1.0 such that the polarization layer is or otherwise includes AlN, and the polarization layer has a thickness between its top and bottom surfaces, the thickness in the range of 1 nm to 5 nm.

Example 56 includes the subject matter of any of Examples 50 through 55, wherein the polarization layer is or otherwise includes $Al_xGa_{1-x}N$, wherein Al is aluminum, Ga is gallium, N is nitrogen, and x is in the range of greater than 0.1 up to and including 0.5.

Example 57 includes the subject matter of Example 56, wherein x is in the range of 0.35 to 0.5, and the polarization layer has a thickness between its top and bottom surfaces, the thickness in the range of 1 nm to 10 nm.

Example 58 includes the subject matter of any of Examples 50 through 57, wherein the polarization layer is or otherwise includes $Al_xIn_yGa_{1-x-y}N$, wherein Al is aluminum, In is indium, Ga is gallium, N is nitrogen, x is in the range of 0.9 to 1.0, and y is in the range of 0.05 to 0.1.

Example 59 includes the subject matter of any of Examples 50 through 58, wherein the polarization layer is or otherwise includes $In_xGa_{1-x}N$, wherein In is indium, Ga is gallium, N is nitrogen, and x is in the range of 0.05 to 0.2.

Example 60 includes the subject matter of any of Examples 50 through 59, wherein the n-type doped layer of $In_zGa_{1-z}N$ has a dopant concentration in the range of $1\times10^{18}$ to $1\times10^{21}$ atoms/cm$^3$.

Example 61 includes the subject matter of Example 60, wherein the dopant concentration is in the range of $5\times10^{19}$ to $3\times10^{20}$ atoms/cm$^3$.

Example 62 includes the subject matter of any of Examples 50 through 61, wherein the n-type doped layer of $In_zGa_{1-z}N$ is doped with silicon.

Example 63 includes the subject matter of any of Examples 50 through 62, wherein the n-type doped layer of $In_zGa_{1-z}N$ is doped with germanium.

Example 64 includes the subject matter of any of Examples 50 through 63, wherein z is in the range of 0.05 to 0.2.

Example 65 includes the subject matter of any of Examples 50 through 64, wherein z is 0.0 such that the n-type doped layer of $In_zGa_{1-z}N$ is GaN. Note that such doped GaN is distinct from and in addition to the gallium nitride layer over the substrate.

Example 66 includes the subject matter of any of Examples 50 through 65, wherein z is 1.0 such that the n-type doped layer of $In_zGa_{1-z}N$ is InN.

Example 67 includes the subject matter of any of Examples 50 through 66, wherein the n-type doped layer of $In_zGa_{1-z}N$ has a thickness between its top and bottom surfaces, the thickness in the range of 20 nm to 2 microns.

Example 68 includes the subject matter of any of Examples 50 through 67, wherein the n-type doped layer of $In_zGa_{1-z}N$ has a thickness between its top and bottom surfaces, the thickness in the range of 20 nm to 200 nm.

Example 69 includes the subject matter of any of Examples 50 through 68, wherein the signal conductor of the transmission line is connected to a passive component, the passive component including at least one of a resistor, an inductor, and a capacitor.

Example 70 includes the subject matter of any of Examples 50 through 69, wherein the signal conductor of the transmission line is connected to a transistor.

Example 71 includes the subject matter of Example 70, wherein the transistor is a gallium nitride transistor including at least part of the gallium nitride layer, and the transistor further includes source and drain regions adjacent the channel region, each of the source and drain regions including n-type doped $In_zGa_{1-z}N$.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:
1. An integrated circuit, comprising:
a substrate of silicon;
a first layer over the substrate and comprising a first group III-N compound, the first group III-N compound including nitrogen and gallium;

a structure over the first layer and including
- a second layer comprising a second group III-N compound compositionally different from the first group III-N compound, the second group III-N compound including nitrogen and two or more of gallium, indium, and aluminum, and
- a third layer over the second layer and including a third group III-N compound compositionally different from the first and second group III-N compounds, the third layer comprising nitrogen, an n-type dopant, and one or both of gallium and indium; and
- a transmission line over the structure and including a signal conductor and at least one ground conductor, the at least one ground conductor electrically connected to the structure.

2. The integrated circuit of claim 1 wherein the second group III-N compound is $Al_{0.83}In_{0.17}N$, wherein Al is aluminum, In is indium, and N is nitrogen.

3. The integrated circuit of claim 1 wherein the second group III-N compound is $Al_xIn_{1-x}N$, wherein Al is aluminum, In is indium, N is nitrogen, and x is in the range of greater than 0.83 up to and including 1.0.

4. The integrated circuit of claim 3 wherein x equals 1.0 such that the second group III-N compound is AlN, and the second layer has a thickness between its top and bottom surfaces, the thickness in the range of 1 nm to 5 nm.

5. The integrated circuit of claim 1 wherein the second group III-N compound is $Al_xGa_{1-x}N$, wherein Al is aluminum, Ga is gallium, N is nitrogen, and x is in the range of greater than 0.1 up to and including 0.5.

6. The integrated circuit of claim 1 wherein the second group III-N compound is $Al_zIn_yGa_{1-x-y}N$, wherein Al is aluminum, In is indium, Ga is gallium, N is nitrogen, x is in the range of 0.9 to 1.0, and y is in the range of 0.05 to 0.1.

7. The integrated circuit of claim 1 wherein the second group III-N compound is $In_xGa_{1-x}N$, wherein In is indium, Ga is gallium, N is nitrogen, and x is in the range of 0.05 to 0.2.

8. The integrated circuit of claim 1 wherein the third group III-N compound has an n-type dopant concentration in the range of $5\times10^{19}$ to $3\times10^{20}$ atoms/cm$^3$.

9. The integrated circuit of claim 1 wherein the n-type dopant is silicon.

10. The integrated circuit of claim 1 wherein the third group III-N compound is $In_zGa_{1-z}N$, wherein In is indium, Ga is gallium, N is nitrogen, and z is in the range of 0.05 to 0.2.

11. The integrated circuit of claim 1 wherein the third group III-N compound excludes indium.

12. The integrated circuit of claim 1 wherein the third group III-N compound excludes gallium.

13. The integrated circuit of claim 1 wherein the third group III-N compound includes both indium and gallium, and the n-type dopant is silicon, and the third layer has a thickness between its top and bottom surfaces, the thickness in the range of 20 nm to 200 nm.

14. The integrated circuit of claim 1 wherein the signal conductor of the transmission line is connected to one or both of a transistor and a passive component, the passive component including at least one of a resistor, an inductor, or a capacitor.

15. The integrated circuit of claim 1, wherein the signal conductor of the transmission line is connected to a transistor, and wherein the transistor includes at least part of the first layer, and wherein the transistor further includes source and drain regions, each of the source and drain regions including an n-type doped group III-N compound including nitrogen and one or both of indium and gallium.

16. The integrated circuit of claim 1 wherein the integrated circuit is part of a system-on-chip comprising a radio frequency (RF) circuit.

17. An integrated circuit, comprising:
- a bulk silicon substrate;
- a gallium nitride layer over the substrate;
- a ground shield over the substrate, the ground shield including
  - a polarization layer comprising a group III-N compound, wherein the polarization layer has a thickness in a direction orthogonal to the substrate, the thickness in the range of 1 nm to 30 nm, and
  - an n-type doped layer of $In_zGa_{1-z}N$, wherein In is indium, Ga is gallium, N is nitrogen, and z is in the range of 0.0 to 1.0, the n-type doped layer of $In_zGa_{1-z}N$ having a dopant concentration in the range of $1\times10^{18}$ to $1\times10^{21}$ atoms/cm$^3$, wherein the n-type doped layer of $In_zGa_{1-z}N$ has a thickness in a direction orthogonal to the substrate, the thickness in the range of 20 nm to 2 microns;
- a transmission line over the ground shield, the transmission line including a signal conductor and at least one ground conductor, the at least one ground conductor electrically connected to the ground shield; and
- at least one dielectric layer between the transmission line and the ground shield.

18. The integrated circuit of claim 17 wherein the ground shield includes the polarization layer, and the polarization layer is $Al_{0.83}In_{0.17}N$, wherein Al is aluminum, In is indium, and N is nitrogen.

19. An integrated circuit, comprising:
- a substrate of silicon;
- a first layer over the substrate and comprising a first group III-N compound, the first group III-N compound consisting essentially of nitrogen and gallium;
- a second layer on the first layer and comprising a second group III-N compound compositionally different from the group compound, the second group III-N compound including nitrogen and two or more of gallium, indium, and aluminum;
- a third layer on the second layer and including a third group III-N compound compositionally different from the first and second group III-N compounds, the third layer comprising nitrogen, an n-type dopant, and one or both of gallium and indium; and
- a transmission line over the third layer and including a signal conductor and a ground conductor, the ground conductor connected to the third layer by a via.

20. The integrated circuit of claim 19 wherein the second layer induces formation of a two-dimensional electron gas (2DEG) in the first layer, thereby providing a conductive ground shield between the substrate and the transmission line.